United States Patent
Chou et al.

(10) Patent No.: US 9,771,260 B2
(45) Date of Patent: Sep. 26, 2017

(54) METHOD OF PROTECTING MICROELECTRO MECHANICAL SYSTEM DEVICE

(71) Applicant: TAIWAN SEMICONDUCTOR MANUFACTURING COMPANY, LTD., Hsinchu (TW)

(72) Inventors: Bruce C. S. Chou, Hsinchu (TW); Chen-Chih Fan, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 14/755,080

(22) Filed: Jun. 30, 2015

(65) Prior Publication Data
US 2015/0298969 A1    Oct. 22, 2015

Related U.S. Application Data

(62) Division of application No. 13/293,917, filed on Nov. 10, 2011, now Pat. No. 9,073,748.

(51) Int. Cl.
*B81C 1/00*   (2006.01)
*B81B 7/00*   (2006.01)
*H01L 23/31*  (2006.01)

(52) U.S. Cl.
CPC ........ *B81C 1/00825* (2013.01); *B81B 7/0054* (2013.01); *B81C 1/00301* (2013.01); *H01L 23/3135* (2013.01); *H01L 2224/48091* (2013.01); *H01L 2224/48227* (2013.01); *H01L 2224/8592* (2013.01); *H01L 2924/1461* (2013.01); *H01L 2924/181* (2013.01)

(58) Field of Classification Search
CPC ....... H01L 2924/00; H01L 2224/73265; H01L 2224/32245; H01L 2224/97; H01L 2224/48247; H01L 2224/48257; H01L 2924/10253; H01L 2924/15747; H01L 2224/85; H01L 21/568; H01L 23/3135; H01L 23/4334
USPC ......... 257/E21.001, E23.031, 415, 419, 675; 438/122, 50, 51
See application file for complete search history.

(56) References Cited

U.S. PATENT DOCUMENTS

| | | | |
|---|---|---|---|
| 5,019,554 A * | 5/1991 | Takeshita ......... | H01L 21/76891 257/702 |
| 5,145,793 A * | 9/1992 | Oohara ............ | H01L 21/02381 136/256 |
| 7,260,051 B1 * | 8/2007 | Rust ................ | B82Y 10/00 250/306 |
| 7,391,707 B2 | 6/2008 | Rust et al. | |
| 7,538,354 B2 * | 5/2009 | Hayashi .......... | H01L 51/5253 257/40 |
| RE43,442 E | 6/2012 | Hayashi et al. | |
| 2007/0222008 A1 * | 9/2007 | Chen ................ | B81C 1/00896 257/415 |

(Continued)

*Primary Examiner* — Edward Chin
(74) *Attorney, Agent, or Firm* — Hauptman Ham, LLP

(57) ABSTRACT

A method includes placing a microelectromechanical system (MEMS) device over a carrier, wire bonding the MEMS device to a bond pad on the carrier with a bond wire, and spray coating a buffer layer over the MEMS device and enclosing the bond wire. A Young's modulus value of the buffer layer is less than a Young's modulus value of the MEMS device.

20 Claims, 3 Drawing Sheets

(56) References Cited

U.S. PATENT DOCUMENTS

| | | | |
|---|---|---|---|
| 2008/0073213 A1* | 3/2008 | Taboryski | F04B 19/006 204/600 |
| 2008/0278731 A1* | 11/2008 | Majumdar | G01N 33/54373 356/498 |
| 2009/0127680 A1* | 5/2009 | Do | H01L 21/568 257/675 |
| 2010/0055841 A1* | 3/2010 | Ozawa | B81B 7/0051 438/113 |
| 2010/0279491 A1* | 11/2010 | Kiuchi | B32B 7/06 438/464 |
| 2011/0180914 A1 | 7/2011 | Do et al. | |
| 2011/0260204 A1* | 10/2011 | Akagawa | H01L 27/3246 257/99 |
| 2012/0025398 A1* | 2/2012 | Jang | H01L 21/565 257/777 |
| 2012/0078469 A1* | 3/2012 | Karner | B29C 45/0017 701/36 |
| 2012/0160299 A1* | 6/2012 | Reid | B32B 7/12 136/246 |
| 2012/0200200 A1* | 8/2012 | Jung | H01L 41/0478 310/365 |
| 2012/0219793 A1* | 8/2012 | Fritz | B81C 1/00396 428/339 |
| 2013/0118265 A1* | 5/2013 | Besling | G01L 9/0042 73/724 |
| 2013/0119493 A1* | 5/2013 | Chou | B81B 7/0054 257/417 |

* cited by examiner

METHOD OF PROTECTING MICROELECTRO MECHANICAL SYSTEM DEVICE

PRIORITY CLAIM

The present application is a divisional of U.S. application Ser. No. 13/293,917, filed Nov. 10, 2011, the disclosure of which is incorporated herein by reference in its entirety.

TECHNICAL FIELD

The present disclosure relates generally to a microelectromechanical system (MEMS), and, more particularly, to a MEMS encapsulation.

BACKGROUND

For MEMS devices, packaging has been a challenging topic to improve its quality and stability, such as temperature coefficient of offset (TCO) or zero-motion offset (ZMO) for motion sensors like accelerometers and gyroscopes, etc. These related issues are caused by the packaging stress. A large TCO or ZMO makes it difficult to design a stable MEMS device over a wide range of temperature or in various applications.

In some MEMS packaging with molding compound to encapsulate the MEMS device, a big difference in Young's modulus values and coefficients of thermal expansion (CTE) between different materials will induce a large residual thermal stress on the MEMS device and cause a measurement TCO or ZMO issue, which is also a function of ambient temperature and humidity. This stress-induced offset issue is undesirable for MEMS devices.

BRIEF DESCRIPTION OF THE DRAWINGS

Reference is now made to the following descriptions taken in conjunction with the accompanying drawings, in which.

DETAILED DESCRIPTION

Figure 1A:
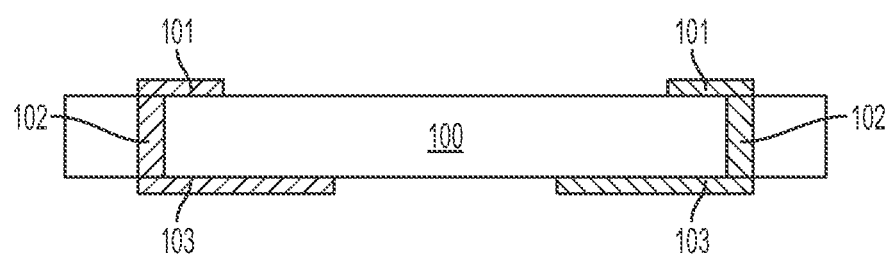
FIGS. 1A-1D are exemplary intermediate steps for encapsulating a MEMS device according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one feature's relationship to another feature. The spatially relative terms are intended to cover different orientations of the device including the features.

FIGS. 1A-1D are exemplary intermediate steps for encapsulating a MEMS device according to some embodiments. In FIG. 1A, a carrier 100 is shown with front side bond pads 101 for wire bonding, through carrier vias 102, and back side solder pads 103 for a surface-mount technology (SMT) process. The carrier 100 can comprise semiconductor materials such as Si, ceramics such as $Al_2O_3$ or AlN, any combination thereof, or any other suitable material. Also, the carrier 100 can be a printed circuit board (PCB) or a lead frame carrier. In one example, the carrier 100 is Si interposer having an area of 2×2 $mm^2$ with a thickness of about 300 µm.

The front side bond pads 101, through carrier vias 102, and back side solder pads 103 can comprise any suitable electrically conductive material, e.g., copper, aluminium, etc., and be formed using suitable processes. For example, the process may include etching the carrier 100 to provide space for the vias 102, via plating (e.g., using Cu), metal layer deposition for the front side bond pads 101 and/or the back side solder pads 103 by physical vapor deposition (PVD), chemical vapor deposition (CVD), or any other suitable process.

Figure 1B:
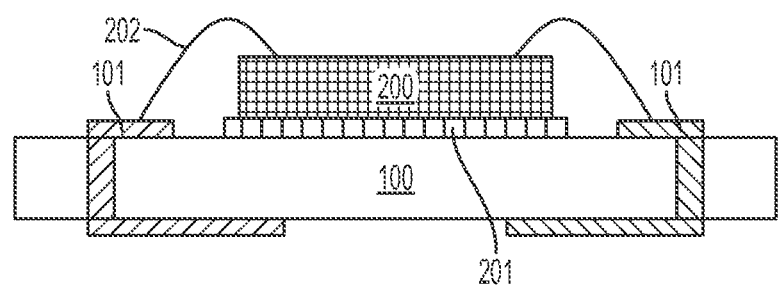

In FIG. 1B, a MEMS device 200 with a die attach film 201 attached on the backside of the MEMS device 200 is placed (i.e., mounted) over the carrier 100. In some embodiments, the carrier 100 comprises Si to reduce stress impact during the fabrication process on the MEMS device 200 also comprising Si. The die attach film 201 functions as a stress buffer for the MEMS device 200. A bond wire 202 connects the MEMS device 200 and the front side carrier bond pads 101 on the carrier 100. The bond wire 202 comprises copper, aluminium, gold, or any other suitable material.

The die attach film 201 has a lower Young's modulus compared to the MEMS device 200. In some embodiments, the difference of Young's modulus between the die attach film 201 and the MEMS device 200 (e.g., Si) is by at least two orders of magnitude. For example, the MEMS device 200 comprising Si (silicon) has a Young's modulus of about 150 Gpa, and the die attach film 201 has a Young's modulus of about 1.5 Gpa or less. With a greater difference in Young's modulus, the softer material with the lower value will buffer the applied stress more. The die attach film 201 can comprise a soft polymer material. One exemplary commercially available die attach film is Nitto Denko part. No. EM-700J-P, which has a Young's modulus on the order of magnitude of about tens of Mpa, e.g., approximately 12 Mpa.

In one example, the MEMS device 200 has an area of about 1.5×1.5 $mm^2$ with a thickness of about 500 µm, and the die attach film 201 has a thickness from about 20 µm to about 50 µm. For fabrication, the die attach film 201 is first attached to the wafer back side of the MEMS device 200. After dicing of the wafer of MEMS device 200, each MEMS device 200 die with the same size of the die attach film 201 can be picked up and placed on the respective carrier 100 for packaging as shown in FIG. 1B.

Figure 1C:
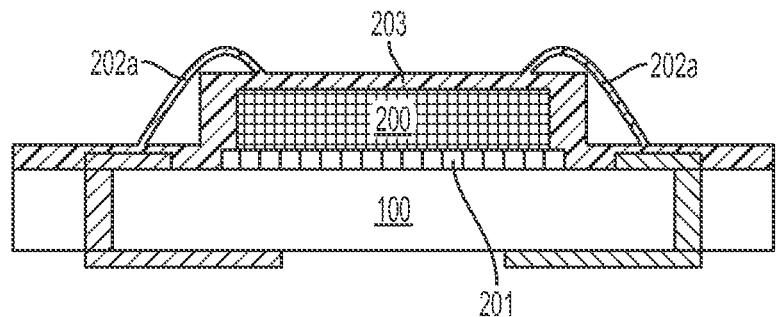

In FIG. 1C, a (stress) buffer layer 203 covers the MEMS device 200 and the carrier 100. In some embodiments, the buffer layer 203 can be formed by a soft polymer coating, and bond wires 202a are also enclosed by such coating. For example, a spray coating method can be used to form the buffer layer 203 in order to uniformly deposit the buffer layer 203 film on the surface of the MEMS device 200 and the carrier 100, as well as coating the bond wire 202 in FIG. 1B. In another fabrication process, a metal shadow mask could be used to define total coverage of MEMS device 200 and partial coverage of the carrier 100 surface (not shown in FIG. 1C). The MEMS device 200 is fully encapsulated by the die attach film 201 and the buffer layer 203. The buffer layer 203 and the die attach film 201 function as a stress buffer for the MEMS device 200.

The buffer layer 203 comprises with a material having a low Young's modulus compared with the MEMS device 200 (e.g., Si) with at least two orders of magnitude difference in some embodiments. The buffer layer 203 can be soft polymer material. One commercially available exemplary material is soft silicone material, such as commercially available ShinEtsu LPS series silicone. In one embodiment, the thickness of the buffer layer 203 is from about 20 µm to about 50 µm.

Figure 1D:
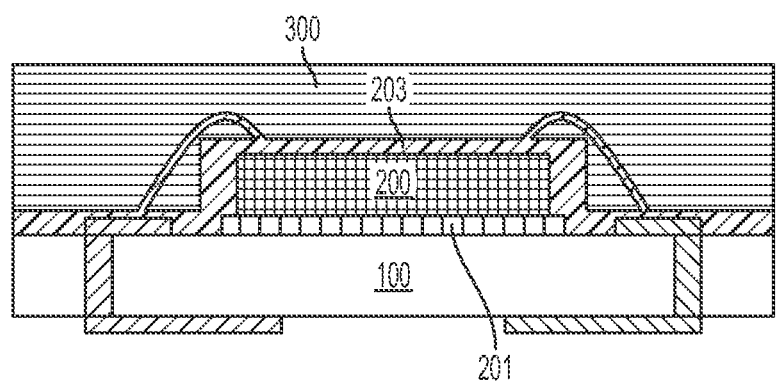

In FIG. 1D, a protection layer 300, e.g., a harder polymer such as epoxy or commercially available molding compound, is formed over the buffer layer 203 (and enclosed bond wires 202a) to protect the MEMS device 200 from ambient interferences. The protection layer 300 can be formed, e.g., by an injection molding process, hot embossing process, or any other suitable method. In one embodiment, the protection layer 300 has an area of 2×2 mm² with a thickness of about 200 µm. In another embodiment, the protection layer 300 could comprise the same material as the buffer layer 203. Under this condition, the buffer layer 203 and the protection layer 300 could be formed at the same time by spray coating or any other suitable methodology.

Compared to some other MEMS enclosures without the buffer layer 203, the buffer layer 203 having a lower Young's modulus than the MEMS device 200 (e.g., comprising Si) such as shown in FIG. 1D will reduce the impact of stress on the MEMS device 200 from the molding compound of the protection layer 300 and the carrier 100 during the molding process and a later SMT process.

In one example, the MEMS device 200 and the carrier 100 has a Young's modulus value of about 150 Gpa (Si) with CTE of 3 ppm, the molding compound material in the protection layer 300 has a Young's modulus value of about 26.5 Gpa with CTE of 7 ppm. When the buffer layer 203 having a thickness of about 20-50 µm and CTE of 220 ppm is used, the stress on the MEMS device 200 was reduced from 120 Mpa to less than 10 Mpa when the temperature varied from 125° C. to 25° C.

Figure 2:
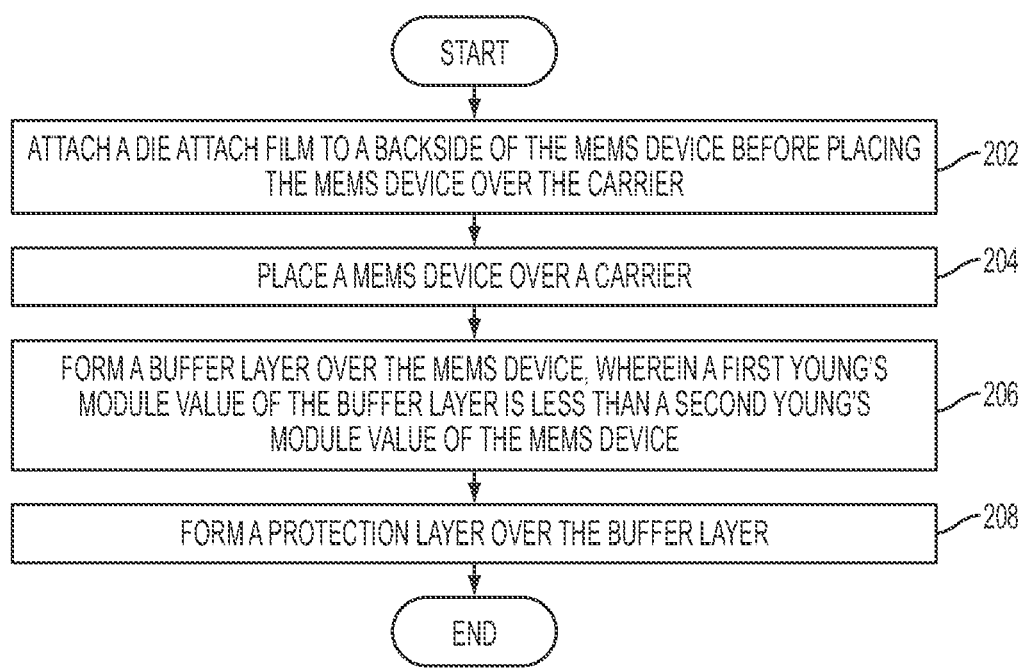
FIG. 2 is a flowchart of an exemplary method of encapsulating a MEMS device according to some embodiments.

FIG. 2 is a flowchart of an exemplary method of encapsulating a MEMS device according to some embodiments. The exemplary processes of the method are described above in FIGS. 1A-1D. At step 202, a die attach film is attached to a backside of the MEMS device before placing the MEMS device over the carrier. In some other embodiments, the die attach film may be placed on the carrier and then the MEMS device may be placed over the die attach film and the carrier. At step 204, a MEMS device is placed over a carrier. At step 206, a buffer layer is formed over the MEMS device and the carrier, wherein a first Young's module value of the buffer layer is less than a second Young's module value of the MEMS device. At step 208, a protection layer is formed over the buffer layer.

In various embodiments, the buffer layer is formed by spray coating. The carrier comprises Si, $Al_2O_3$, AlN, or any combination thereof. The MEMS device and a bond pad on the carrier are connected by a bond wire. The bond wire is enclosed by the buffer layer.

In various embodiments, the protection layer comprises the same material and formed at the same time as the buffer layer. The first Young's modulus value is less than the second Young's modulus value by at least two orders magnitude. The second Young's modulus value is about 130-150 Gpa in some embodiments.

According to some embodiments, a method comprises placing a microelectromechanical system (MEMS) device over a carrier, wire bonding the MEMS device to a bond pad on the carrier with a bond wire, and spray coating a buffer layer over the MEMS device and enclosing the bond wire. A Young's modulus value of the buffer layer is less than a Young's modulus value of the MEMS device.

According to some embodiments, a method comprises placing a microelectromechanical system (MEMS) device over a carrier, wire bonding the MEMS device to a bond pad on the carrier with a bond wire, depositing a buffer layer over the MEMS device and enclosing the bond wire, and depositing a protection layer over the buffer layer. The buffer layer comprises a first portion coated on the bond wire, and a second portion coated on the MEMS device. The protection layer comprises a portion between the first portion and the second portion of the buffer layer. A Young's modulus value of the buffer layer is less than a Young's modulus value of the MEMS device.

According to some embodiments, a method comprises placing a microelectromechanical system (MEMS) device over a carrier. The method further comprises depositing a buffer layer which has a Young's modulus value less than a Young's modulus value of the MEMS device, over the MEMS device. The method further comprises depositing a protection layer, which has a Young's modulus value greater than the Young's modulus value of the buffer layer, over the buffer layer.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of the embodiments of the disclosure. Embodiments that combine different claims and/or different embodiments are within the scope of the disclosure and will be apparent to those skilled in the art after reviewing this disclosure.

What is claimed is:
1. A method, comprising:
placing a microelectromechanical system (MEMS) device in direct contact with a carrier;
wire bonding the MEMS device to a bond pad on the carrier with a bond wire;

spray coating a buffer layer on the wire bonded MEMS device and the bond wire; and depositing a protection layer in direct contact with a top surface of the buffer layer of the buffer layer coated bond wire, wherein a Young's modulus value of the buffer layer is less than a Young's modulus value of the MEMS device.

2. The method of claim 1, further comprising:

attaching a die attach film to at least one of a backside of the MEMS device or the carrier, wherein, in said placing the MEMS device over the carrier, the MEMS device is attached to the carrier by the die attach film.

3. The method of claim 1, wherein said placing the MEMS device over the carrier comprises placing the MEMS device over the carrier which comprises at least one material selected from the group consisting of Si, $Al_2O_3$, and AlN.

4. The method of claim 1, further comprising: depositing the protection layer over the entire buffer layer.

5. The method of claim 4, wherein said depositing the protection layer comprises depositing the protection layer comprising a same material as the buffer layer.

6. The method of claim 4, wherein said depositing the protection layer comprises depositing the protection layer having a coefficient of thermal expansion (CTE) smaller than a CTE of the buffer layer.

7. The method of claim 6, wherein said depositing the protection layer comprises depositing the protection layer having the CTE greater than a CTE of each of the carrier and the MEMS device.

8. The method of claim 4, wherein said spray coating the buffer layer comprises spray coating a material of the buffer layer having the Young's modulus value less than a Young's modulus value of the protection layer.

9. The method of claim 1, wherein said spray coating the buffer layer comprises spray coating a material of the buffer layer having the Young's modulus value less than $1/100$ of the Young's modulus value of the MEMS device.

10. The method of claim 1, wherein said placing the MEMS device over the carrier comprises placing the MEMS device having the Young's modulus value of 130-150 giga-Pascals (Gpa).

11. A method, comprising:

placing a microelectromechanical system (MEMS) device over a carrier;

wire bonding the MEMS device to a bond pad on the carrier with a bond wire;

depositing a buffer layer over the MEMS device and enclosing the bond wire, wherein the buffer layer comprises:
a first portion coated on the bond wire, and
a second portion coated on the MEMS device; and depositing a protection layer over the buffer layer, wherein the protection layer comprises a portion between the first portion and the second portion of the buffer layer, wherein a Young's modulus value of the buffer layer is less than a Young's modulus value of the MEMS device.

12. The method of claim 11, wherein said depositing the buffer layer comprises spray coating a material of the buffer layer over the MEMS device.

13. The method of claim 11, wherein said depositing the buffer layer comprises depositing the buffer layer comprising at least one polymer material.

14. The method of claim 11, wherein said depositing the buffer layer comprises depositing the buffer layer having the Young's modulus value less than $1/100$ of the Young's modulus value of the MEMS device.

15. A method, comprising:

placing a microelectromechanical system (MEMS) device over a carrier;

depositing a buffer layer, which has a Young's modulus value less than a Young's modulus value of the MEMS device, over the MEMS device; and depositing a protection layer, which has a Young's modulus value greater than the Young's modulus value of the buffer layer, over the buffer layer.

16. The method of claim 15, further comprising: wire bonding the MEMS device to a bond pad on the carrier with a bond wire.

17. The method of claim 16, wherein said depositing the buffer layer comprises enclosing the bond wire in the buffer layer.

18. The method of claim 15, wherein said depositing the buffer layer comprises spray coating a material of the buffer layer over the MEMS device.

19. The method of claim 15, wherein said depositing the buffer layer comprises depositing a material of the buffer layer having the Young's modulus value at least 100 times less than the Young's modulus value of the MEMS device.

20. The method of claim 19, wherein said placing the MEMS device over the carrier comprises placing the MEMS device having the Young's modulus value of 130-150 giga-Pascals (Gpa).

* * * * *